United States Patent
Fury et al.

(10) Patent No.: US 6,857,437 B2
(45) Date of Patent: Feb. 22, 2005

(54) AUTOMATED DENSE PHASE FLUID CLEANING SYSTEM

(75) Inventors: Michael A. Fury, San Francisco, CA (US); Robert W. Sherrill, San Rafael, CA (US)

(73) Assignee: EKC Technology, Inc., Hayward, CA (US)

(*) Notice: Subject to any disclaimer, the term of this patent is extended or adjusted under 35 U.S.C. 154(b) by 0 days.

(21) Appl. No.: 10/465,905

(22) Filed: Jun. 18, 2003

(65) Prior Publication Data

US 2004/0255978 A1 Dec. 23, 2004

(51) Int. Cl.[7] .............................................. B08B 3/00
(52) U.S. Cl. .................... 134/56 R; 134/105; 134/107; 134/108; 134/184; 134/195; 134/902
(58) Field of Search ............................. 134/56 R, 105, 134/107, 108, 184, 195, 902, 18, 58 R, 188

(56) References Cited

U.S. PATENT DOCUMENTS

| | | | | |
|---|---|---|---|---|
| 5,013,366 A | * | 5/1991 | Jackson et al. ................. 134/1 |
| 5,268,102 A | * | 12/1993 | Clay et al. ................... 210/634 |
| 5,582,715 A | * | 12/1996 | McBrayer, Jr. et al. ..... 210/96.1 |
| 5,777,726 A | * | 7/1998 | Krone-Schmidt ............ 356/38 |
| 6,503,410 B1 | * | 1/2003 | Blalock et al. ................ 216/68 |
| 2002/0144717 A1 | * | 10/2002 | Tunnicliffe et al. ........... 134/26 |
| 2004/0065353 A1 | * | 4/2004 | Tunnicliffe et al. ........... 134/26 |

* cited by examiner

Primary Examiner—M. Kornakov
(74) Attorney, Agent, or Firm—Morgan, Lewis & Bockius LLP

(57) ABSTRACT

Initially, process parameters for dense phase fluid cleaning are determined. Thereafter, a cleaning chamber containing a substrate is pressurized with a dense phase fluid, based on these process parameters. The substrate is then cleaned with the dense phase fluid, again based on these process parameters. Exhaust fluid is subsequently expelled from the cleaning chamber, and thereafter analyzed. The process parameters are then adjusted to adjusted process parameters based on the analysis of the exhaust fluid. Thereafter, the cleaning chamber is again pressurized and cleaning repeated. This pressurization and cleaning is based on the adjusted process parameters. Also, this pressurization and cleaning is repeated until the substrate is sufficiently clean.

16 Claims, 3 Drawing Sheets

OPERATION

```
                Start
                 302

Determine Standards          ⎫  Setup (Figure 2)
            303                      ⎪  Temperature(s)
                                     ⎬  Pressure(s)
        Determine Initial               Time(s)
        Process Parameters           ⎪  Co-solvent(s)
            304                      ⎪  Dense Phase Fluid(s)
                                     ⎭  Etc.
        Place Substrate in
        Cleaning Chamber
            306

Set Initial
        Temperature
            308

Purge Cleaning Chamber  ←─────────┐
            310                           │
                                          │
        Add Chem Agent                    │
            312                           │
                                          │
        Fill Cleaning Chamber             │
            314                           │
                                          │
        Clean / Cycle                     │
            316                           │
                                          │
        Measure P and T                   │
            318                           │
                                          │
        Expel Exhaust Fluid               │
            320                           │
                                322       │
  Visual ┐                                │
  332 ─┤ ├── Analyze Exhaust Fluid        │
  Other ┘                                 │
  334         Compare to Standards  324   │
                                          │
              Meets                       │
              Predetermined ──No──→ Adjust Process
              Standard?              Parameters
              326                       328
               │ Yes
              End
              330
```

FIG. 3

AUTOMATED DENSE PHASE FLUID CLEANING SYSTEM

BACKGROUND OF THE INVENTION

1. Field of the Invention

The present invention relates generally to semiconductor substrate cleaning systems. More particularly, the present invention relates to an automated system and method for controlling a dense phase fluid cleaning system by analyzing contaminant removal.

2. Description of Related Art

Generally, semiconductor substrates, such as silicon wafers, are processed into semiconductor chips by sequentially exposing each substrate to a number of individual processes, such as photo masking, etching, implantation, and cleaning. Cleaning typically requires cleaning resist and/or etching residue from the surface of the substrate.

Generally, there are two methods for cleaning the surface of a substrate, namely, wet and dry processing. Wet processing consists of a series of steps of spraying and/or immersing the substrate in expensive chemical solutions or solvents. These conventional solvent aided cleaning processes are currently being re-evaluated due to environmental concerns. In addition, recent environmental legislation mandates that many of the organic solvents used in wet processes be banned or their use severely limited. Dry processing, on the other hand, consists of a series of steps that use gases instead of wet chemical solutions to clean the substrate. For example, ashing using an O2 plasma. However, such processes often leave a residue after dry cleaning, which is unacceptable because such residue may cause device failures or limit operation efficiency.

More recently, dense phases gases or fluids, such as carbon dioxide ($CO_2$) with or without co-solvents or surfactants, have been introduced to remove etch residue and/or photoresist from semiconductor substrates. A dense phase fluid is a gas compressed to either supercritical or subcritical conditions to achieve liquid like densities. These dense phase fluids or fluid mixtures are also referred to as dense fluids. Unlike organic solvents, such as n-hexane or 1,1,1 trichloroethane, dense fluids exhibit unique physical and chemical properties such as low surface tension, low viscosity, and variable solute carrying capacity.

Cleaning with dense phase fluids is desirable, as such fluids retain the properties of a liquid, but have the diffusivity and viscosity of a gas. In addition, dense phase fluid cleaning technology can be applied in many industrial processes to significantly reduce or eliminate the use of hazardous chemicals, to conserve natural resources such as water, and to accomplish tasks previously not possible, such as rapid precision cleaning of small features of semiconductor devices (e.g., resist images, VLSI (Very Large Scale Integration) topographical features such as vias, etc.). Supercritical fluids act as a solvent to remove contaminants from the wafer surface and effectively clean the surface of the substrate. However, the cleaning effectiveness of supercritical dense phase fluids is typically enhanced by the addition of chemical agents or co-solvents that react with materials used in semiconductor manufacturing. As the addition of chemical agents, such as co-solvents, is typically not entirely eliminated using dense phase fluid cleaning, a system and method that continually monitors chemical usage during cleaning to keep such chemical agents to allowable standards would be highly desirable.

Moreover, dense phase fluid cleaning has a multitude of adjustable process parameters, such as pressure, temperature, process times, amount of co-solvent used, etc. Accordingly, it is difficult to determine the optimal process parameters for cleaning. Therefore, a system and method that optimizes such process parameters would be highly desirable.

To further complicate matters, every substrate being cleaned has different topographical features and a different composition. Therefore, there are generally no ultimate predefined process parameters that can accurately account for all substrates to remove all contaminants. Accordingly, a system and method that automatically accounts for the variations of each substrate, in real time, would be highly desirable.

BRIEF SUMMARY OF THE INVENTION

According to the invention there is provided a computer controlled dense phase fluid cleaning system. The cleaning system preferably includes a cleaning chamber, an analyzer, a controller, and a temperature control system. The cleaning chamber has an inlet for receiving dense phase fluid, and an outlet for expelling exhaust fluid. The analyzer is fluidly coupled to the outlet and configured for analyzing the exhaust fluid. The controller is electrically coupled to the analyzer for controlling a dense phase fluid cleaning process within the cleaning chamber based at least partially on analysis of the exhaust fluid by the analyzer. The temperature control system is also electrically coupled to the controller. The temperature control system controls the temperature within the chamber. A pressure pump is preferably coupled to the controller, and is preferably located along a dense phase fluid circuit between the outlet and the inlet.

In a preferred embodiment, the temperature control system is a heater within the chamber, or a cooling system. The cooling system preferably includes a cooling jacket surrounding the chamber, a coolant reservoir fluidly coupled to an inlet of the cooling jacket, a heat exchanger fluidly coupled between the inlet of the cooling jacket and an outlet of the cooling jacket, and a pump fluidly coupled between the inlet of the cooling jacket and an outlet of the cooling jacket. The pump is preferably electrically coupled to the controller.

In a preferred embodiment, a pump is fluidly coupled between the inlet of the cooling jacket and an outlet of the cooling jacket This pump is also electrically coupled to the controller. In a preferred embodiment, a separator is fluidly coupled to the outlet. The separator is configured to separate contaminants from the exhaust fluid. A chemical agent reservoir may also be coupled to the fluid circuit. Similarly, an agitator may be located within the cleaning chamber.

Further, according to another embodiment of the invention there is provided an automated method for cleaning a substrate using a dense phase fluid. Process parameters for dense phase fluid cleaning are determined. Thereafter, a cleaning chamber containing a substrate is pressurized with a dense phase fluid, based on the process parameters. The substrate is then cleaned with the dense phase fluid based on the process parameters. Exhaust fluid is expelled from the cleaning chamber and analyzed. The process parameters are then reset to adjusted process parameters based on this analysis. The pressurizing and cleaning is then repeated based on the adjusted process parameters, until the substrate is clean.

In a preferred embodiment, the pressurizing includes pumping a dense phase fluid into the cleaning chamber. Also, the temperature and pressure are preferably continually measured within the cleaning chamber. The temperature and pressure are also preferably controlled based on the process parameters. The analysis of the exhaust fluid preferably determines the concentration of contaminants, chemical agents, reaction byproduct(s), chemical marker(s), and any combination of the aforementioned components within the exhaust fluid. In addition, the process parameters include temperature(s); pressure(s); time spent at each temperature; time spent at each pressure; time spent at each temperature and pressure combination; type of chemical agent; type of dense phase fluid; volume of chemical agent; volume of dense phase fluid; combination of chemical agents; combination of dense phase fluids; phase shifting frequency; pressure cycling; or the like.

Accordingly, the invention more efficiently and effectively removes contaminants from the substrate. In addition, the invention automatically accounts for the variations of each substrate, in real time.

BRIEF DESCRIPTION OF THE DRAWINGS

For a better understanding of the nature and objects of the invention, reference should be made to the following detailed description, taken in conjunction with the accompanying drawings, in which:

FIG. 3 is a flow chart of the process for cleaning a substrate using the automated dense phase fluid cleaning system described in claim 1.

Like reference numerals refer to corresponding parts throughout the several views of the drawings.

DETAILED DESCRIPTION OF THE INVENTION

Figure 1:
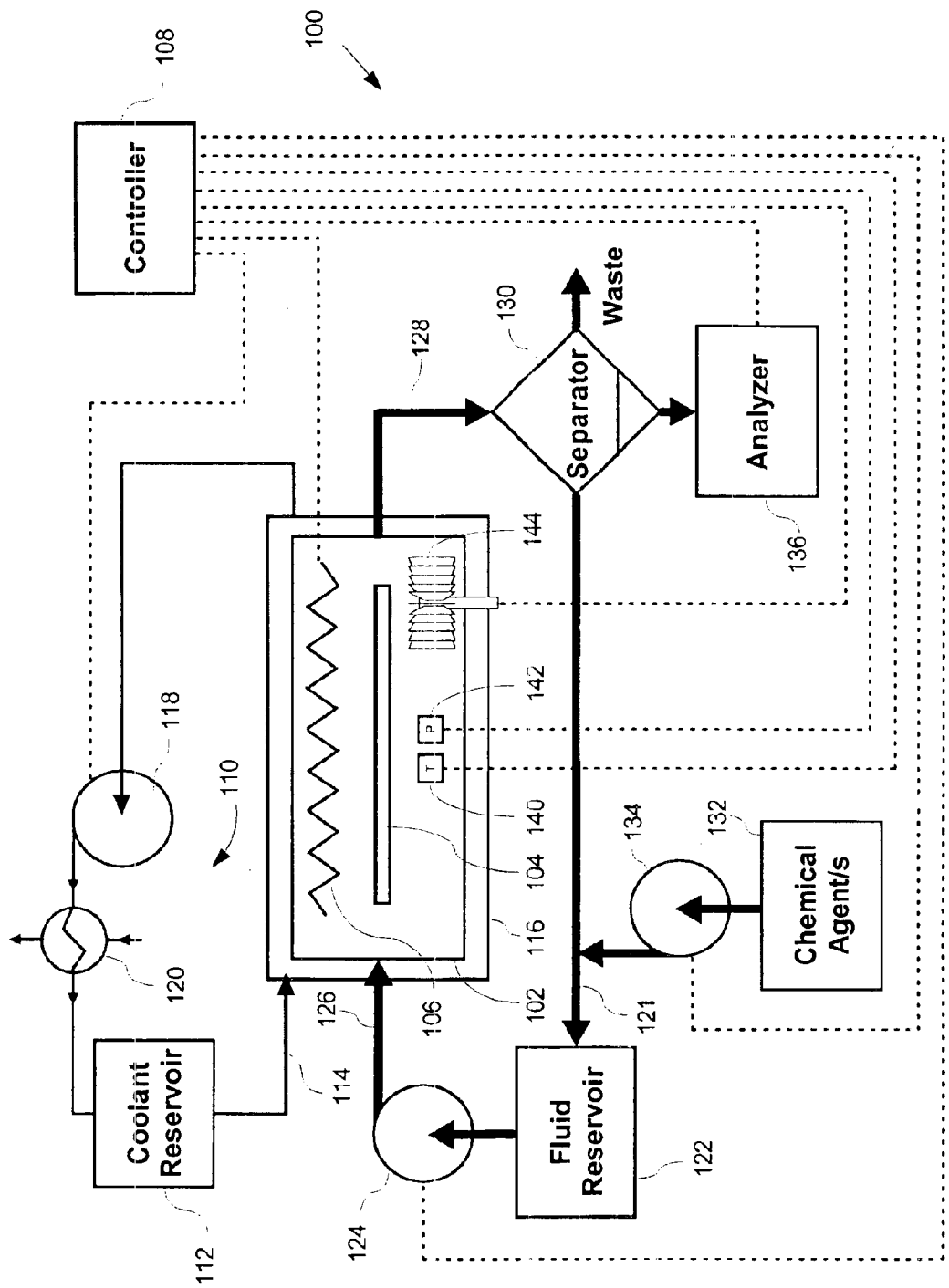
FIG. 1 is a diagrammatic block diagram of an automated dense phase fluid cleaning system employing feedback control.

FIG. 1 is a diagrammatic block diagram of an automated dense phase fluid cleaning system 100 according to an embodiment of the invention. The system 100 is used for cleaning a substrate 104. The substrate 104 is preferably a semiconductor wafer, but may be any other component that requires cleaning. Although only one substrate is described in the following detailed description, it should be appreciated that any number of substrates may be processed concurrently. For example, the substrate 104 could consist of a batch of multiple individual substrates. Indeed, it is common for twenty-five to one hundred wafers to be processed concurrently in a semiconductor batch, where the cleaning system 100 is configured to accommodate the entire batch of substrates.

The dense phase fluid cleaning system 100 preferably includes a cleaning chamber 102 in which dense phase fluid is used to clean the substrate 104. Dense phase fluids include any of the known gases which may be converted to supercritical fluids or liquefied at temperatures and pressures which will not degrade the physical or chemical properties of the substrate being cleaned. These gases typically include, but are not limited to: (1) hydrocarbons, such as methane, ethane, propane, butane, pentane, hexane, ethylene, and propylene; (2) halogenated hydrocarbons such as tetrafluoromethane, chlorodifluoromethane, sulfur hexafluoride, and perfluoropropane; (3) inorganics such as carbon dioxide, ammonia, helium, krypton, argon, sulfur trioxide and nitrous oxide; and (4) mixtures thereof. The term "dense phase fluid", as used herein, is intended to include mixtures of such dense phase fluids.

In addition, the dense phase fluid used to remove a particular contaminant is chosen to have a solubility chemistry which is similar to that of the targeted contaminant. For example, if hydrogen bonding makes a significant contribution to the internal cohesive energy content, or stability, of a contaminant, the chosen dense phase fluid must possess at least a moderate hydrogen bonding ability in order for solvation to occur. In some cases, a mixture of two or more dense phase fluids may be combined to have the desired solvent properties. The selected dense phase fluid must also be compatible with the substrate being cleaned, and preferably has a low cost and high health and safety ratings. Furthermore, the dense phase fluid may include one or more chemical agents, such as co-solvents or surfactants, to assist in the removal of undesired contaminants from the substrate.

Carbon dioxide is a preferred dense phase fluid for use in practicing the present invention since it is inexpensive and non toxic. The critical temperature of carbon dioxide is about 305 degree Kelvin (32 degrees C.), and the critical pressure is about 72.9 atmospheres (1057 psi). A more detailed description of these critical pressures and temperatures can be found in U.S. Pat. No. 5,013,366, which is incorporated by reference herein. At pressures above the critical pressure, the phase of the carbon dioxide can be shifted between a liquid phase and a supercritical fluid phase by varying the temperature above or below the critical temperature of 305 Kelvin (K). In addition, liquid carbon dioxide is useful for cleaning when at pressures of between about 4.14 atmospheres (60 psi) to about 34.47 atmospheres (500 psi) at least about 305 degree Kelvin (32 degrees C.). Likewise, gaseous carbon dioxide is useful for cleaning when at pressures of between about 72 atmospheres (1044 psi) to about 206 atmospheres (3000 psi) at least about 305 degree Kelvin (32 degrees C.). The temperature may be elevated, which could assist in cleaning efficiency. The process temperature is limited by the substrate material.

In a preferred embodiment, the cleaning chamber 102 is configured to operate at internal pressures of between about 4.14 atmospheres (60 psi) to about 206 atmospheres (3000 psi). In a more preferred embodiment, the cleaning chamber 102 is configured to operate at internal pressures of between about 6.9 atmospheres (100 psi) and about 138 atmospheres (2000 psi). In a most preferred embodiment, the cleaning chamber 102 is configured to operate at internal pressures of between about 4.14 atmospheres (60 psi) to about 34.47 atmospheres (500 psi) at about 305 degree Kelvin (32 degrees C.) for liquids, and between about 73.77 atmospheres (1070 psi) to about 124.1 atmospheres (1800 psi) at least about 305 degree Kelvin (32 degrees C.).

To operate at these high pressures, the cleaning chamber 102 is designed to have characteristics well know to those skilled in the art. For example, the cleaning chamber 102 may have an annular or spherical interior to spread the internal pressure, may be made from suitable steels, such as SS 316, or the like.

The system 100 further comprises a temperature control system. The temperature control system preferably comprises a heater assembly 106 located within the chamber 102, to raise the temperature within the chamber 102. The heater assembly 106 is preferably electrically coupled to a controller 108. In a preferred embodiment, the heater assembly is a resistive heating element that is electrically and chemically isolated from direct contact with the dense phase fluid. The controller 108 is preferably a computer that precisely controls the temperature of the heater assembly 106, preferably by controlling power supplied to the heater assembly 106. The controller 108 preferably receives analog or digital inputs, such as temperature and pressure within the cleaning chamber or results from the analyzer 136, and transmits analog or digital outputs to the temperature control system and various pumps and/or valves. The controller preferably includes a Central Processing unit (CPU), communication circuitry, input/output ports, and a memory containing an operating system, a database, and other measurement and control software, such as menu driven Advanced Process Development and Control (APDC) software.

The system may further include an agitator 144 to circulate fluids while the chamber is held at a constant pressure. In a preferred large volume batch system, the agitator is a propeller type agitator for mechanically stirring the dense phase fluid, while in a preferred single wafer semiconductor chamber the agitator is a rotating wafer chuck, where movement of fluid across the substrate surface is achieved by rotating the substrate. Alternatively, the agitator may be recirculating jets with a closed loop at the same pressure as the chamber pressure to keep the fluid moving, or an inlet jet designed to ensure continuous fluid movement across the substrate surface even as the chamber is held at constant pressure. In yet another embodiment, any combination of the above would also be satisfactory.

The temperature control system also preferably includes a cooling system 110 configured to lower the temperature within the cleaning chamber 102. The cooling system 110 preferably includes: a coolant reservoir 112 for storing coolant; a coolant jacket 116 or other suitable structure that may surround the cleaning chamber 102 but could also be a cooling coil, or the like; a pump 118 for circulating coolant around a coolant circuit 124; a heat exchanger 120 for removing heat from the coolant; and various valves (not shown). The pump 118 is electrically coupled to the controller 108. In use, the controller 108 lowers the temperature within the cleaning chamber 102 by operating the pump 118 to introduce coolant from the coolant reservoir 112 through a coolant line 114 into and through the coolant jacket 116. Warmer coolant expelled from the coolant jacket 116 is passed through the heat exchanger 120 to remove excess heat before storing the coolant in the coolant reservoir 112. Accordingly, the controller 108 can accurately raise or lower the temperature within the cleaning chamber 102 by operating the heater assembly 106 or the coolant system 110.

The system 100 also includes a dense phase fluid cleaning system itself. The dense phase fluid cleaning system includes: a dense phase fluid circuit 121; a dense phase fluid reservoir 122; a pressure pump 124; an inlet line 126 for introducing dense phase fluid into the cleaning chamber 102; and an outlet line 128 for expelling exhaust fluid from the cleaning chamber 102. The dense phase fluid cleaning system also preferably includes one or more chemical agent reservoir(s) 132 and a chemical agent pump 134 for pumping the chemical agent(s) contained within the chemical agent reservoir(s) into the dense phase fluid circuit 121. The term chemical agent, as used herein, includes one or more co-solvents surfactants, additives, or the like. The pressure pump 124 and chemical agent pump 134 is electronically coupled the controller 108. In use, the controller 108 operates the pressure pump 124 and chemical agent pump 134 to introduce a dense phase fluid, with or without chemical agents, into the cleaning chamber 102 via the fluid inlet 126. To maintain the pressure within the cleaning chamber 102, exhaust fluid is expelled from the cleaning chamber 102 via the outlet 128.

The system 100 also preferably includes an analyzer system for determining the composition of the exhaust fluid. The analyzer system preferably comprises a separator 130 for separating out the components of the exhaust fluid. The analyzer system also preferably includes an analyzer 136 for analyzing the separated out components. The analyzer may be a visual identification apparatus like a microscope, a gravimetric analyzer, a spectroscopic analyzer, a chromatographic analyzer, or the like. The analyzer is electrically coupled to the controller 108.

Finally, the system 100 also preferably includes a temperature sensor 140 and a pressure sensor 142 contained within the cleaning chamber 102. Both the temperature sensor 140 and the pressure sensor 142 are electrically coupled to the controller 108.

The process for cleaning the substrate 104 using a dense phase fluid and controlled by the controller 108 is described with reference to FIG. 3. Normal cleaning times are typically on the order of twenty to sixty minutes for a batch process and less than three minutes, with one minute preferred, for a single substrate process.

Figure 2:
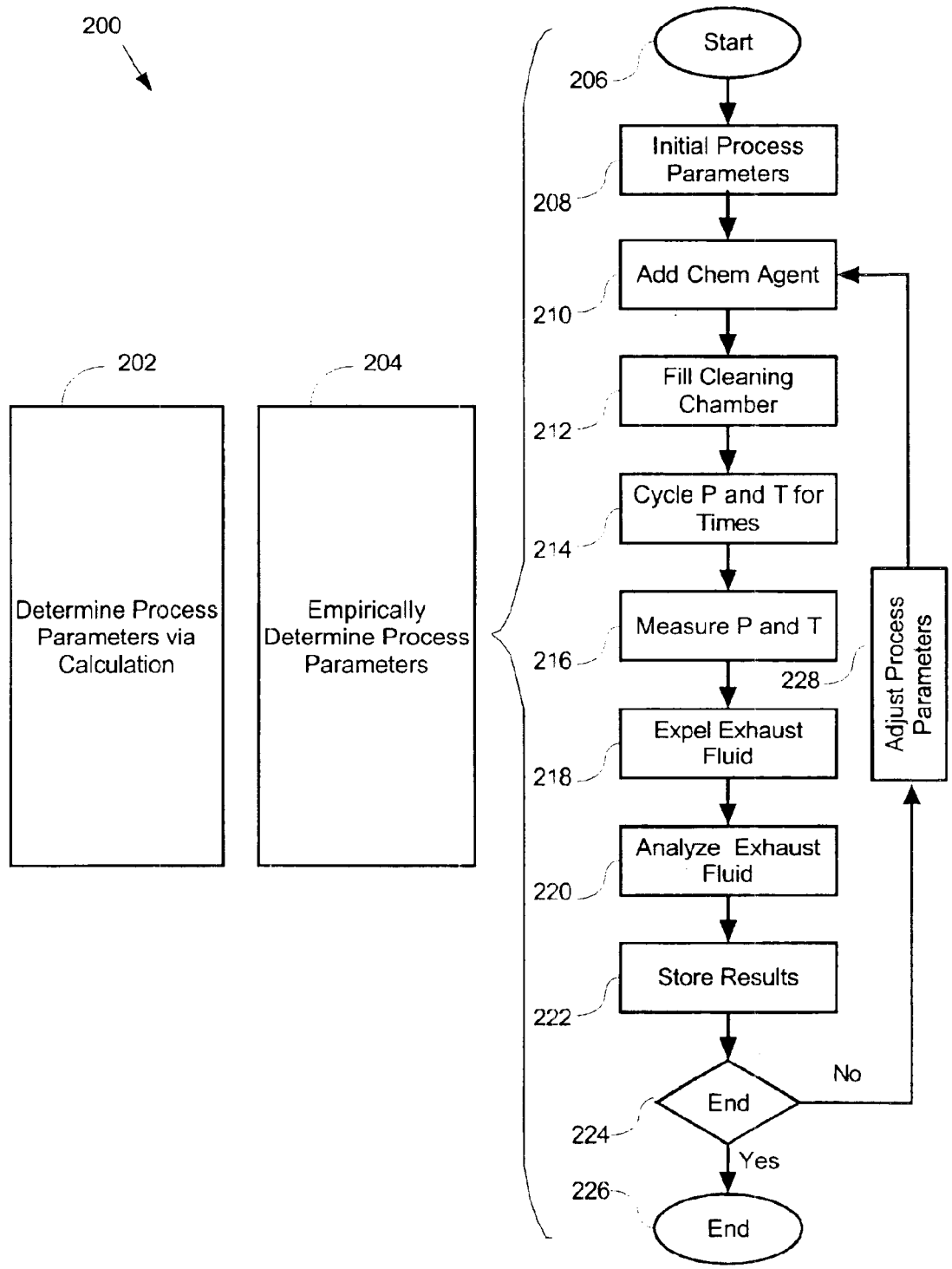
FIG. 2 is a flow chart of a process for setting up or obtaining the initial process parameters used by the automated dense phase fluid cleaning system described in FIG. 1.

FIG. 2 is a flow chart of a method 200 for obtaining the process parameters required for cleaning the substrate using the system 100 of FIG. 1. Process parameters include the initial temperature and pressure of the cleaning chamber before introduction of the dense phase fluid, the recipe for performing the dense phase fluid cleaning, or the like. The recipe includes the pressures and temperatures through which the cleaning chamber should cycle during cleaning, the number of phase shift cycles, the change in temperature for each step in the cycle, and the residence time at each temperature and/or pressure. The recipe is dependent upon the extent of contaminant removal which is required.

In a preferred embodiment, the values of operating temperature and pressure used in practicing the process of the present invention are calculated using one of two methods. First, the process parameters may be determined through calculation 202, where the cohesive energy value of the contaminants is computed or a solubility value is obtained from published data, and thereafter a set of pressure/temperature values is computed based upon both the critical temperature and pressure data of the selected dense phase fluid, and using known gas solvent equations. These calculations are performed by the controller 108 (FIG. 1). Second, the process parameters may be determined empirically 204.

The process 204 for determining the process parameters empirically is initiated at step 206. An initial or preliminary set of process parameters is loaded into the memory of the controller 108 (FIG. 1) at step 208. These initial process parameters may be those calculated in step 202 or they may be entered by an operator of the system. In accordance with these initial process parameters, a chemical agent is added to the dense phase fluid circuit 121 (FIG. 1) at step 210. The cleaning chamber is then pressurized or filled with the dense phase fluid, with or without chemical agents, at step 212. This dense phase fluid and chemical agent(s) may be either fresh, recycled, or recirculated. The substrate in the cleaning chamber is then cleaned using the dense phase fluid, preferably by subjecting the substrate to one or more phase shift cycles, in accordance with the process parameters, at step 214. During cleaning, the pressure and temperature is constantly measured by the sensors 140 and 142 (FIG. 1) at step 216. The exhaust fluid containing the removed contaminants is subsequently expelled from the cleaning chamber at step 218.

The separator 130 (FIG. 1) then preferably separates the dense phase fluid from the remainder of the exhaust fluid.

The analyzer 136 then analyzes the contents of the remainder of the exhaust fluid at step 220. Such an analysis preferably determines the amount, quality, type, concentration and/or purity of contaminants and or chemical agents present in the exhaust fluid. Visual, gravimetric, spectroscopic, or chromatographic analysis may be used for this purpose.

The extent of contaminant removal is then correlated with the various process parameters to determine whether an optimum amount of contaminants has been removed. In a preferred embodiment, the optimum amount of contaminant is all contaminants, or at least all detectable contaminants. The results of the analysis are then stored in the controller's memory at step 222. The controller then determines whether it has completed the process 204 for determining the process parameters empirically at step 224. This may be determined by running the process 204 a predetermined amount of times, obtaining a predetermined amount of data, etc. If it is determined that the process 204 should end (224–Yes), the process ends at step 226. Alternatively, if it is determined that the process 204 should not end (224—no), the process parameters are adjusted, at step 228, and the process repeated until the controller determines that the process 204 is completed. Adjustment of the process parameters may include adjusting the initial temperature and/or pressure, adjusting the cleaning pressures and/or temperatures, adjusting the amount or type of chemical agent added to the dense phase fluid, adjusting the times spent each temperature and/or pressure, or the like. In this way, depending on the results obtained, selected process parameters may be varied and their effect on the extent of contaminant removal determined. Accordingly, the optimum process parameters for the particular cleaning requirements may be determined. Typical process parameters which have been found to be useful include, but are not limited to, the following: variation of the temperature above the critical temperature by about 5 to 100 K; variation of the temperature below the critical temperature by about 5 to 25 K; step changes in temperature of about 5 to 10 K; and residence time at each step of about one to sixty minutes. It should be noted that such process parameters may vary based on the substrate being cleaned.

FIG. 3 is a flow chart of a process 300 for cleaning a substrate using the automated dense phase fluid cleaning system 100 described above in relation to FIG. 1. Once the process 300 has started, at step 302, the controller sets predetermined standards for cleaning the substrate at step 303. These standards preferably include the amount or volume of contaminant that is required to be removed, the amount or volume of chemical agents that should remain in the exhaust fluid after cleaning, etc. These standards are preferably set by an operator of the system 100 (FIG. 1), whereafter the process continues without further human intervention until completed. The initial process parameters are then determined at step 304. The process parameters include: temperature(s); pressure(s); time(s) spent at each temperature or pressure; type and amount or volume of chemical agent(s); type and amount or volume of dense phase fluid(s); concentration of chemical agent(s) or dense phase fluid(s); phase shifting frequency; pressure cycling; or the like. Such initial process parameters are preferably determined using the setup process 200 described above in relation to FIG. 2.

The substrate 104 (FIG. 1) to be cleaned is then placed into the cleaning chamber 102 (FIG. 1) and the initial temperature within the cleaning chamber 102 (FIG. 1) is set, at step 308, using the temperature control system as described above in relation to FIG. 1. The cleaning chamber is then preferably purged at step 310. Purging the cleaning chamber ensures that the only the desired dense phase fluid(s) and/or chemical agent(s) are introduced into the cleaning chamber. Purging the cleaning chamber also reduces contamination from prior cleaning sessions. If required by the process parameters, one or more chemical agents are then added to the dense phase fluid at step 312. The amount and type of chemical agent(s) is governed by the process parameters. These chemical agents may be either fresh, recycled, or recirculated.

The cleaning chamber 102 (FIG. 1) is then filled or pressurized by the pressure pump 124 (FIG. 1), at step 314, with the dense phase fluid, with or without chemical agents, via the inlet line 126 (FIG. 1). The cleaning chamber 102 (FIG. 1) is pressurized to a pressure equal to or above the critical pressure for the particular dense phase fluid. This critical pressure is generally between about 20 atmospheres (300 pounds per square inch or 20.6 kilograms per square centimeter) and 102 atmospheres (1500 pounds per square inch or 105.4 kilograms per square centimeter). The processing pressure is preferably between 1 and 272 atmospheres (15 and 4000 pounds per square inch or 1.03 and 281.04 kilograms per square centimeter) above the critical pressure, depending on the breadth of solvent spectrum and associated phase shifting range which are required. This dense phase fluid may be either fresh, recycled, or recirculated.

Cleaning then occurs, at step 316, preferably by subjecting the substrate to one or more phase shift cycles in accordance with the process parameters. Typically, this involves raising and lowering the temperature to cycle the dense phase fluid between a supercritical liquid and a supercritical gas. In other words, the temperature in the cleaning chamber 102 (FIG. 1) is adjusted to a temperature either below the critical temperature (subcritical) or above or equal to the critical temperature (supercritical) for the dense phase fluid. The cleaning chamber 102 (FIG. 1) is next pressurized to a pressure which is greater than or equal to the critical pressure for the fluid. The phase of the dense fluid is then shifted between liquid and supercritical states, as previously described, by varying the temperature over a predetermined range above and below the critical point, as determined by the type and amount of contaminants to be removed. When carbon dioxide is used as the dense fluid the temperature of the cleaning chamber is cycled above and below 305 K. Control of temperature, pressure, and gas flow rates is accomplished under control of the controller 108 (Figure) using known methods and based on measurements taken by the pressure and temperature sensors 140 and 142 (FIG. 1). This cleaning may also involve directing the dense phase fluid with a nozzle, using ultrasonic or mechanical agitation, or the like.

Once the pressure in cleaning chamber 102 (FIG. 1) reaches the desired point above the critical pressure, pressure pump 124 (FIG. 1) may be continually operated and outlet 128 (FIG. 1) opened to provide continuous flow of exhaust fluid through the cleaning chamber while maintaining a constant pressure within the cleaning chamber. Alternatively, the outlet 128 (FIG. 1) may be opened after a sufficient amount of time at a constant pressure drop to remove contaminants, in order to provide for batch processing. For example, a pressure drop of 272 atmospheres (4,000 psi) to 102 atmospheres (1500 psi) over a 20 minute cleaning period can be achieved.

This cleaning may be batch type cleaning or continuous cleaning. Here, "batch" refers to the chemical batch and not to the number of substrates being processed concurrently.

For batch type cleaning, the cleaning chamber 102 (FIG. 1) is pressurized to the desired level and the temperature of the dense phase fluid is adjusted to the starting point for a phase shifting sequence, which is either above or below the critical temperature of the dense phase fluid. The cleaning chamber 102 (FIG. 1) is repeatedly pressurized and depressurized from the original pressure starting point to a pressure below the critical pressure. Sequentially, the temperature of the cleaning chamber 102 (FIG. 1) is adjusted up or down, depending on the types of contaminants, and the pressurization/depressurization steps carried out.

For a continuous cleaning process, the dense fluid is introduced into the cleaning chamber 102 (FIG. 1) by the pressure pump 124 (FIG. 1) at the same rate that contaminated fluid is removed through outlet 128 (FIG. 1) in order to maintain the pressure in the cleaning chamber 102 (FIG. 1) at or above the critical pressure. This type of process provides continual removal of the contaminated exhaust fluids while the phase of the dense fluid within the cleaning chamber 102 (FIG. 1) is being shifted back and forth between subcritical and supercritical states through temperature cycling.

Throughout the cleaning, the pressure and temperature within the cleaning chamber is measured, at step 318, by the sensors 140 and 142 (FIG. 1). These pressure and temperature measurements are transmitted to the controller 108 (FIG. 1) which uses them to continually adjust the pressure and temperature within the cleaning chamber in accordance with the process parameters.

The resulting dense fluid containing contaminants, or exhaust fluid, is then expelled from the outlet 128 (FIG. 1) of the cleaning chamber 102 (FIG. 1) at step 320. A separator 130 (FIG. 1) then preferably removes the entrained contaminants (including chemical agent(s)) from the exhaust fluid, thereby allowing recycling of the dense phase fluid. The dense phase fluid is re-circulated to the fluid reservoir 122 (FIG. 1) for reuse, while the entrained contaminants are analyzed by the analyzer 136 (FIG. 1), at step 322, to determine the contaminant removal level. Such an analysis preferably determines the amount, quality, type, concentration and/or purity of contaminants and or chemical agents present in the exhaust fluid.

Such an analysis 322 may be by a visual analysis 332 or other suitable analysis 334. Such an analysis determines the amount and type of contaminants present in the exhaust fluid, the amount of chemical agent remaining in the exhaust stream, etc. Gravimetric, spectroscopic, or chromatographic analysis may be used for this purpose. It should be noted that the amount of contaminants present in the exhaust fluid is inversely proportional to the amount of chemical agent present in the exhaust fluid, i.e., as the contaminants increase the chemical agent decreases and visa versa.

The results of the analysis are then fed to the controller where they are compared against the predetermined standards at step 324. In a preferred embodiment, the predetermined standard is removing all contaminants from the substrate, or at least removing all detectable contaminants from the substrate. The controller then determines from this comparison 324 whether the cleaning of the substrate meets the predetermined standards at step 326. If the cleaning meets the predetermined standards (326—Yes) then the process ends at step 330. However if the cleaning does not meet the predetermined standards (326—No), then the process parameters are adjusted, at step 328, the cleaning chamber purged, at step 310, and the process steps 310–330 repeated until such time that the predetermined standards are met at step 326. The cleaning chamber 12 may be repressurized with dense phase fluid and depressurized as many times as required at each temperature change. Typical process parameters which have been found to be useful include, but are not limited to, the following: variation of the temperature above the critical temperature by about 5 to 100 K; variation of the temperature below the critical temperature by about 5 to 25 K; step changes in temperature of about 5 to 10 K; and residence time at each step of about one to sixty minutes. It should be noted that such process parameters may vary based on the substrate being cleaned. This feedback loop of determining whether the standards have been met and adjusting the process parameters is preferably performed in real-time and in an automated manner, i.e., without any further human interaction. However, in a preferred embodiment, an override may exist allowing an operator to cancel the automated cleaning cycle.

The foregoing descriptions of specific embodiments of the present invention are presented for purposes of illustration and description. They are not intended to be exhaustive or to limit the invention to the precise forms disclosed. For example, any methods described herein are merely examples intended to illustrate one way of performing the invention. Obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Furthermore, the order of steps in the method are not necessarily intended to occur in the sequence laid out. It is intended that the scope of the invention be defined by the following claims and their equivalents.

What we claim is:

1. A computer controlled dense phase fluid clang system, comprising:
    a cleaning chamber having an inlet for receiving dense phase fluid, and an outlet for expelling exhaust fluid;
    an analyzer fluidly coupled to said outlet and configured for analyzing said exhaust fluid and registering a value of said analysis;
    a dense phase fluid circuit between said outlet and said inlet, wherein said dense phase fluid circuit is adapted to re-circulate back into said cleaning chamber a portion of said exhaust fluid that has had contaminants removed therefrom; and
    a controller electrically coupled to said analyzer and adapted to both repeatedly control recirculation of said portion of exhaust fluid back into said cleaning chamber and control a dense phase fluid cleaning process within said cleaning chamber until such time that said value of the analysis of said exhaust fluid by said analyzer indicates that a predetermined standard has been met.

2. The computer controlled dense phase fluid cleaning system of claim 1, further comprising a temperature control system electrically coupled to said controller, where said temperature control system controls the temperature within said chamber.

3. The computer controlled dense phase fluid cleaning system of claim 2, wherein said temperature control system comprises a heater within said chamber.

4. The computer controlled dense phase fluid cleaning system of claim 3, wherein said heater is electrically coupled to said controller and is configured to raise the temperature within said chamber.

5. The computer controlled dense phase fluid cleaning system of claim 3, wherein said heater is a resistive heating element.

6. The computer controlled dense phase fluid cleaning system of claim 2, wherein said temperature control system comprises a cooling system.

7. The computer controlled dense phase fluid cleaning system of claim 6, wherein said cooling system comprises a cooling jacket surrounding said chamber.

8. The computer controlled dense phase fluid cleaning system of claim 7, wherein said cooling system further comprises:
- a coolant reservoir fluidly coupled to an inlet of said cooling jacket;
- a heat exchanger fluidly coupled between said inlet of said cooling jacket and an outlet of said cooling jacket; and
- a pump fluidly coupled between said inlet of said cooling jacket and an outlet of said cooling jacket, where said pump is electrically coupled to said controller.

9. The computer controlled dense phase fluid cleaning system of claim 1, further comprising a pressure pump located along said dense phase fluid circuit for re-circulating at least part of said exhaust fluid back into said cleaning chamber, where said pressure pump is electrically coupled to said controller.

10. The computer controlled dense phase fluid cleaning system of claim 1, further comprising a fluid reservoir located along said dense phase fluid circuit, wherein said fluid reservoir stores fluid, including at least part of said exhaust fluid for reuse in said cleaning chamber.

11. The computer controlled dense phase fluid cleaning system of claim 1, further comprising a separator fluidly coupled to said outlet, where said separator is configured to separate contaminants from said exhaust fluid for analysis by said analyzer.

12. The computer controlled dense phase fluid cleaning system of claim 1, further comprising a chemical agent reservoir coupled to said fluid circuit wherein said reservoir supplies one or more chemical agents to said circulated part of said exhaust fluid.

13. The computer controlled dense phase fluid cleaning system of claim 1, further comprising an agitator within said cleaning chamber.

14. The computer controlled dense phase fluid cleaning system of claim 1, wherein said repeated control of said dense phase fluid cleaning process within said cleaning chamber is performed in real-time.

15. A computer controlled dense phase fluid cleaning system, comprising:
- a cleaning chamber having an inlet for receiving dense phase fluid, and an outlet for expelling exhaust fluid;
- an analyzer fluidly coupled to said outlet and configured for analyzing said exhaust fluid and registering a value of said analysis;
- a dense phase fluid circuit between said outlet and said inlet, wherein said dense phase fluid circuit is adapted to circulate back into said cleaning chamber a portion of said exhaust fluid that has had contaminants removed therefrom;
- a controller electrically coupled to said analyzer and adapted to both repeatedly control recirculation of said portion of exhaust fluid back into said cleaning chamber and control a dense phase fluid cleaning process within said cleaning chamber until such time that said value of said analysis of said exhaust fluid by said analyzer indicates that a predetermined standard has been met;
- a temperature control system electrically coupled to said controller, where said temperature control system controls the temperature within said chamber; and
- a pressure pump coupled to said controller and located along a dense phase fluid circuit between said outlet and said inlet, wherein said pressure pump is adapted to re-circulate said portion of said exhaust fluid into said cleaning chamber.

16. The computer controlled dense phase fluid cleaning system of claim 15, wherein said repeated control of said dense phase fluid cleaning process within said cleaning chamber is performed in real-time.

* * * * *

UNITED STATES PATENT AND TRADEMARK OFFICE
CERTIFICATE OF CORRECTION

PATENT NO. : 6,857,437 B2
DATED : February 22, 2005
INVENTOR(S) : Michael A. Fury et al.

It is certified that error appears in the above-identified patent and that said Letters Patent is hereby corrected as shown below:

Column 10,
Line 36, please correct "clang" to -- cleaning --.

Column 11,
Line 39, please correct "circulated" to -- re-circulated --.

Signed and Sealed this

Thirty-first Day of May, 2005

JON W. DUDAS
*Director of the United States Patent and Trademark Office*